(12) United States Patent
Chen et al.

(10) Patent No.: US 6,887,757 B2
(45) Date of Patent: May 3, 2005

(54) METHOD OF MANUFACTURING FLASH MEMORY

(75) Inventors: Kuang-Chao Chen, Hsinchu (TW); Hsueh-Hao Shih, Hsinchu (TW); Ling-Wuu Yang, Taichung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 10/249,867

(22) Filed: May 14, 2003

(65) Prior Publication Data

US 2004/0229435 A1 Nov. 18, 2004

(51) Int. Cl.$^7$ ............................................. H01L 21/336
(52) U.S. Cl. ....................... 438/257; 438/197; 438/211; 438/258; 438/262; 438/263; 438/264; 438/593
(58) Field of Search ................................. 438/197, 211, 438/257, 258, 262, 263, 264, 593; 257/315

(56) References Cited

U.S. PATENT DOCUMENTS

| | | | | |
|---|---|---|---|---|
| 3,886,000 A | * | 5/1975 | Bratter et al. | 438/363 |
| 4,306,353 A | * | 12/1981 | Jacobs et al. | 438/200 |
| 5,188,976 A | * | 2/1993 | Kume et al. | 438/258 |
| 5,856,221 A | * | 1/1999 | Clementi et al. | 438/258 |
| 5,861,347 A | * | 1/1999 | Maiti et al. | 438/787 |
| 6,074,915 A | * | 6/2000 | Chen et al. | 438/258 |
| 6,235,585 B1 | * | 5/2001 | Lee et al. | 438/258 |
| 6,248,632 B1 | * | 6/2001 | Jang et al. | 438/261 |
| 6,274,430 B1 | * | 8/2001 | Jan et al. | 438/258 |
| 6,620,693 B2 | * | 9/2003 | Lai et al. | 438/275 |

* cited by examiner

Primary Examiner—Maria F. Guerrero
(74) Attorney, Agent, or Firm—Jiang Chyun IP office

(57) ABSTRACT

A method of fabricating a flash memory device is provided. First, a substrate partitioned into a memory cell region and a peripheral circuit region is provided. A tunnel dielectric layer is formed over the memory cell region and a liner layer is formed over the peripheral circuit region. Thereafter, a patterned gate conductive layer is formed over the substrate. An inter-gate dielectric layer and a passivation layer are sequentially formed over the substrate. The passivation layer, the inter-gate dielectric layer, the gate conductive layer and the liner layer over the peripheral circuit region are removed. A gate dielectric layer is formed over the peripheral circuit region while the passivation layer over the memory cell region is converted into an oxide layer. Another conductive layer is formed over the substrate. The conductive layer, the oxide layer, the inter-gate dielectric layer and the gate conductive layer over the memory cell region are patterned to form a memory gate. The second conductive layer over the peripheral circuit region is similarly patterned to form a gate.

10 Claims, 3 Drawing Sheets

METHOD OF MANUFACTURING FLASH MEMORY

BACKGROUND OF INVENTION

1. Field of Invention

The present invention relates to a method of manufacturing a semiconductor device. More particularly, the present invention relates to a method of manufacturing a flash memory.

2. Description of Related Art

Flash memory is a memory device that allows multiple data reading, writing and erasing operations. In addition, the stored data will be retained even after power to the device is turned off. With these advantages, it has been broadly applied in personal computer and electronic equipment.

A typical flash memory device has a floating gate and a control gate fabricated using doped polysilicon. The control gate is set up above the floating gate with an inter-gate dielectric layer separating the two. Furthermore, a tunneling oxide layer is also set up between the floating gate and an underlying substrate (the so-called stack gate flash memory). Electric charges are injected into or drained away from the floating gate by the application of a positive or negative voltage at the control gate. The presence or absence of electric charges inside the floating gate indicates the state of a data storage unit.

FIGS. 1A to 1D are schematic cross-sectional views showing the progression of steps for producing a conventional flash memory device. The substrate 100 in FIGS. 1A to 1D is partitioned into two major regions, a memory cell region 102 and a peripheral circuit region 104.

First, a tunnel dielectric layer 106 is formed over the memory cell region 102 and a liner layer 108 is formed over the peripheral circuit region 104 as shown in FIG. 1A. Thereafter, a conductive layer 110 is formed over the entire substrate 100. The conductive layer 110 over the memory cell region 102 is patterned to form a linear array of conductive layers 110a. An inter-gate dielectric layer 112 is formed over the substrate 100. The inter-gate dielectric layer 112 comprises an oxide/nitride/oxide composite layer, for example.

As shown in FIG. 1B, a patterned photoresist layer 114 is formed over the substrate 100. The patterned photoresist layer 114 covers the memory cell region 102 but exposes the peripheral circuit region 104. Using the patterned photoresist layer 114 as a mask, the inter-gate dielectric layer 112, the conductive layer 110 and the liner layer 108 on the peripheral circuit region 104 are removed. Thereafter, a gate dielectric layer 116 is formed over the peripheral circuit region 104.

As shown in FIG. 1C, the patterned photoresist layer 114 is removed. A conductive layer 118 is formed over the substrate 100.

As shown in FIG. 1D, the conductive layer 118 is patterned to form a control gate conductive layer 118a over the memory cell region 102. Thereafter, the inter-gate dielectric layer 112, the conductive layer 110a and the tunnel dielectric layer 106 are patterned to form a stack gate structure comprising of the control gate conductive layer 118a, the inter-gate dielectric layer 112a, the conductive layer 110b and the tunnel dielectric layer 106a. In the meantime, the conductive layer 118 on the peripheral circuit region 104 is patterned to form a gate structure comprising of a gate oxide layer 116a and a conductive layer 118b.

In the aforementioned fabrication process, the inter-gate dielectric layer 112 is a thin and brittle film and hence can be easily damaged in an ashing process and a cleaning process after patterning the photoresist layer 114. When the inter-gate dielectric layer 112 is defective, the capacity to retain data inside the flash memory will deteriorate.

On the other hand, if a weaker cleaning agent is deployed to remove the photoresist layer so that any damage to the uppermost oxidation layer of the inter-gate dielectric layer 112 is minimal, some polymer residue from the photoresist material may still cling to the original substrate and lead to a metallic contamination of the gate layer.

SUMMARY OF INVENTION

Accordingly, one object of the present invention is to provide a method of fabricating a flash memory device that protects the inter-gate dielectric layer against any harmful damage so that average performance of the device is improved.

A second object of this invention is to provide a method of fabricating a flash memory device that prevents any polymer residue from contaminating nearby gate layers and thus improves the quality of the gate.

To achieve these and other advantages and in accordance with the purpose of the invention, as embodied and broadly described herein, the invention provides a method of fabricating a flash memory device. First, a substrate partitioned into a memory cell region and a peripheral circuit region is provided. A tunnel dielectric layer is formed over the memory cell region and a liner layer is formed over the peripheral circuit region. Thereafter, a first conductive layer is formed over the substrate. The first conductive layer over the memory cell region is patterned to form a gate conductive layer. An inter-gate dielectric layer is formed over the substrate. A passivation layer is formed over the inter-gate dielectric layer. The passivation layer, the inter-gate dielectric layer, the first conductive layer and the liner layer on the peripheral circuit region are removed. A dielectric layer is formed over the peripheral circuit region. Meanwhile, the passivation layer over the memory cell region is converted into an oxide layer. A second conductive layer is formed over the substrate. The second conductive layer, the oxide layer, the inter-gate dielectric layer and the gate conductive layer on the memory cell region are patterned to form a plurality of memory gates. Finally, the second conductive layer on the peripheral circuit region is patterned to form a plurality of gates.

In the aforementioned method, a passivation layer is formed over the inter-gate dielectric layer above the memory cell region. The passivation layer is able to protect the inter-gate dielectric layer against any possible processing damage so that the quality of the inter-gate dielectric layer can be maintained.

Furthermore, by forming a passivation layer over the inter-gate dielectric layer, stronger chemical agents can be deployed to remove photoresist in a cleaning process. As a result, there will be very little polymer residue to contaminate surrounding gate layers after the cleaning step.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
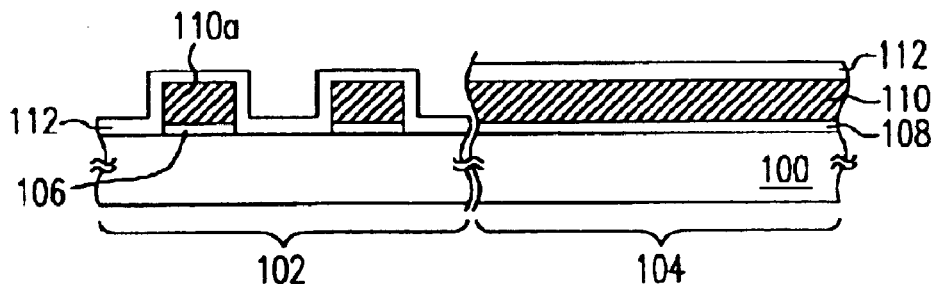
FIGS. 1A to 1D are schematic cross-sectional views showing the progression of steps for producing a conventional flash memory device.
Figure 1B:
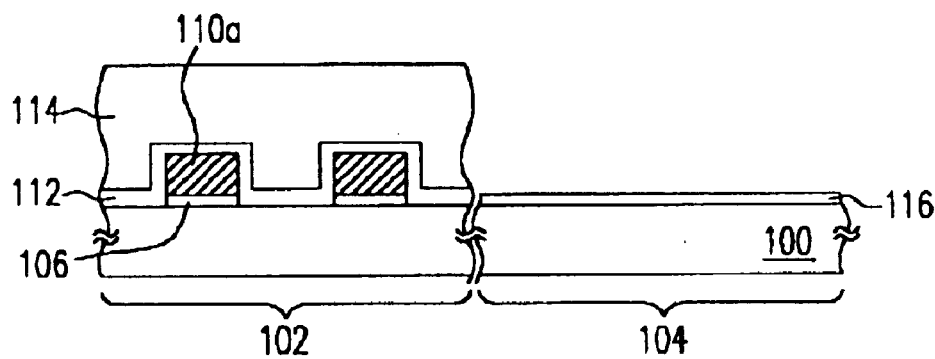
Figure 1C:
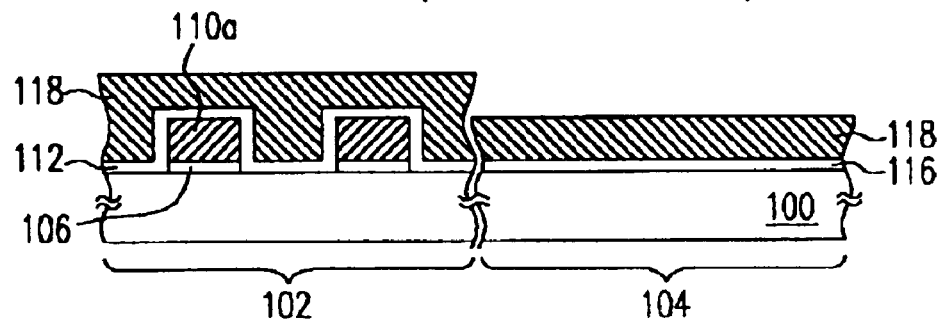
Figure 1D:
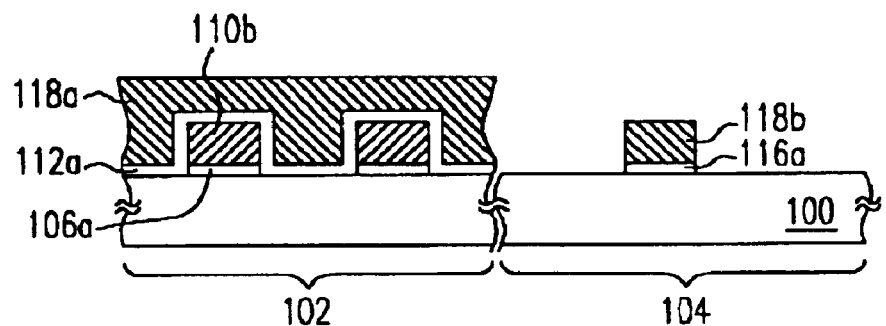

Reference will now be made in detail to the present preferred embodiments of the invention, examples of which are illustrated in the accompanying drawings. Wherever possible, the same reference numbers are used in the drawings and the description to refer to the same or like parts.

FIGS. 2A to 2F are schematic cross-sectional views showing the progression of steps for fabricating a flash memory device according to one preferred embodiment of this invention. The substrate 200 in FIGS. 2A to 2F is partitioned into two regions, a memory cell region 202 and a peripheral circuit region 204.

Figure 2A:
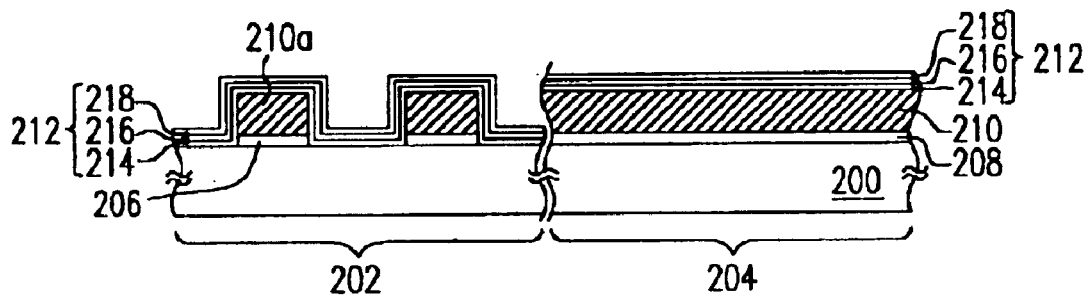
FIGS. 2A to 2F are schematic cross-sectional views showing the progression of steps for fabricating a flash memory device according to one preferred embodiment of this invention.

First, as shown in FIG. 2A, a tunnel dielectric layer 206 is formed over the memory cell region 202 and a liner layer 208 is formed over the peripheral circuit region 204. The tunnel dielectric layer and the liner layer are oxide layers formed, for example, by performing a thermal oxidation process. Thereafter, a conductive layer 210 is formed over the entire substrate 200. The conductive layer 210 is a doped polysilicon formed, for example, by depositing undoped polysilicon in a chemical vapor deposition process and then implanting ions into the undoped polysilicon layer. The conductive layer 210 on the memory cell region 202 is patterned to form an array of linear conductive layers 210a (gate conductive layers). An inter-gate dielectric layer 212 is formed over the substrate 200. The inter-gate dielectric layer 212 comprises an oxide/nitride/oxide composite layer, for example. The inter-gate dielectric layer 212 is formed, for example, by performing a thermal oxidation process to form a bottom oxide layer 214, performing a chemical vapor deposition process to form a silicon nitride layer 216 (serving as a charge-trapping layer) over the bottom oxide layer 214 and finally performing a chemical vapor deposition process to form a top oxide layer 218 over the silicon nitride layer 216.

Figure 2B:
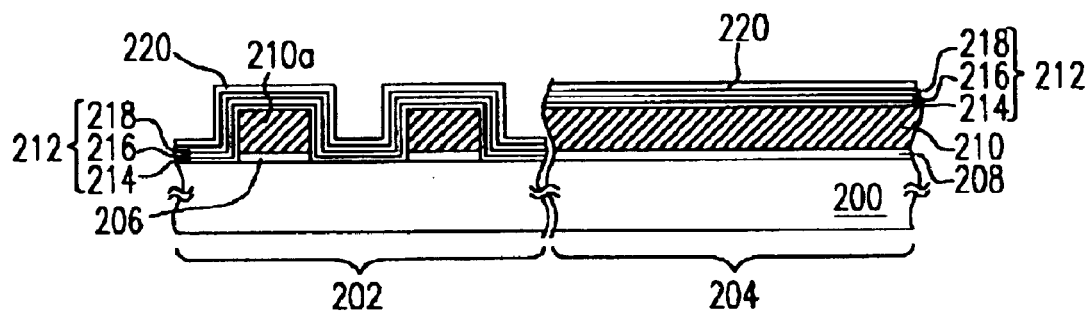

As shown in FIG. 2B, a passivation layer 220 is formed over the substrate 200. The passivation layer 220 is a silicon nitride layer formed, for example, by performing a chemical vapor deposition process.

Figure 2C:
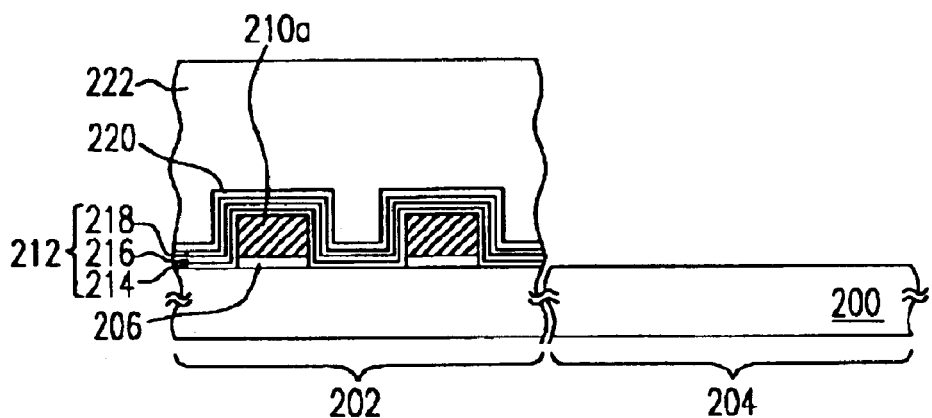

As shown in FIG. 2C, a patterned photoresist layer 222 is formed over the substrate 200. The patterned photoresist layer 222 covers the memory cell region 202 but exposes the peripheral circuit region 204. Thereafter, using the patterned photoresist layer 222 as a mask, the passivation layer 220, the inter-gate dielectric layer 212, the conductive layer 210 and the liner layer 208 above the peripheral circuit region 204 are removed.

Figure 2D:
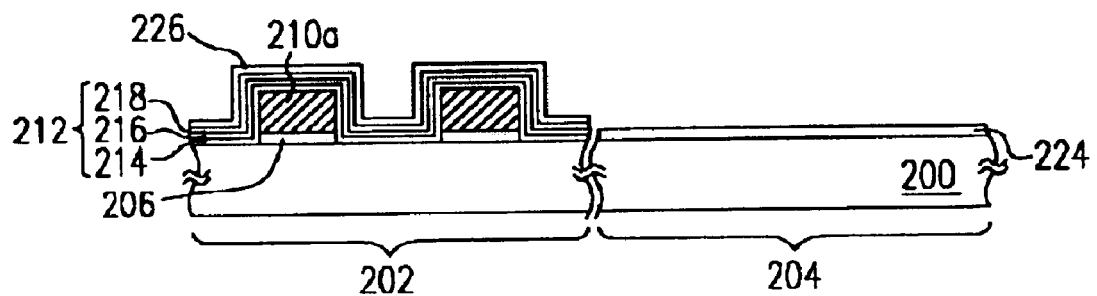

As shown in FIG. 2D, the patterned photoresist layer 222 is removed and the substrate 200 is cleaned according to demand. Thereafter, a gate dielectric layer 224 is formed over the peripheral circuit region 204 while the passivation layer 220 in the memory cell region 202 is converted to an oxide layer 226. The method of forming the gate dielectric layer 224 and converting the passivation layer 220 into the oxide layer 226 includes, for example, performing a thermal oxidation process.

In the aforementioned process of removing the patterned photoresist layer 222 or the cleaning step, the passivation layer 220 over the inter-gate dielectric layer 212 serves as a protective layer. Therefore, a stronger chemical agent (for example, a cleaning agent such as hydrofluoric acid or SC-1 (also known as ammonium peroxide mixture APM)) can be used to remove the photoresist over the substrate 200. Since the inter-gate dielectric layer 212 is protected against any possible damage during the removing process, the photoresist layer 222 is thoroughly removed.

Figure 2E:
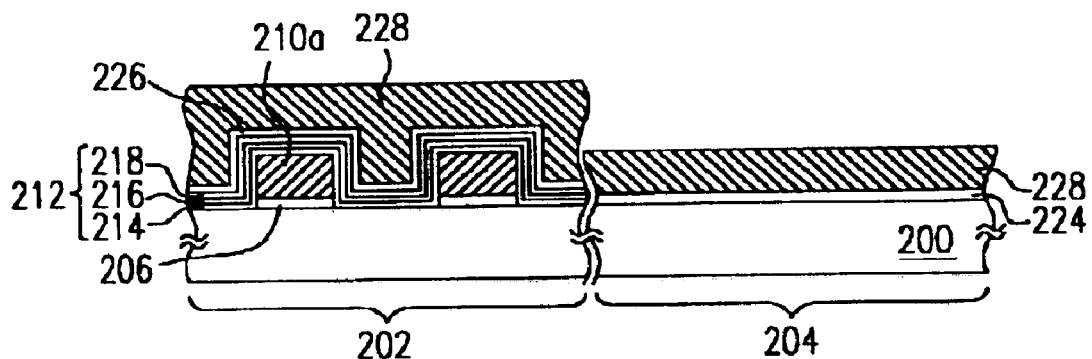

As shown in FIG. 2E, a conductive layer 228 is formed over the substrate 200. The conductive layer 228 is a doped polysilicon formed, for example, by depositing undoped polysilicon over the substrate 200 in a chemical vapor deposition process and implanting ions into the undoped polysilicon layer thereafter.

Figure 2F:
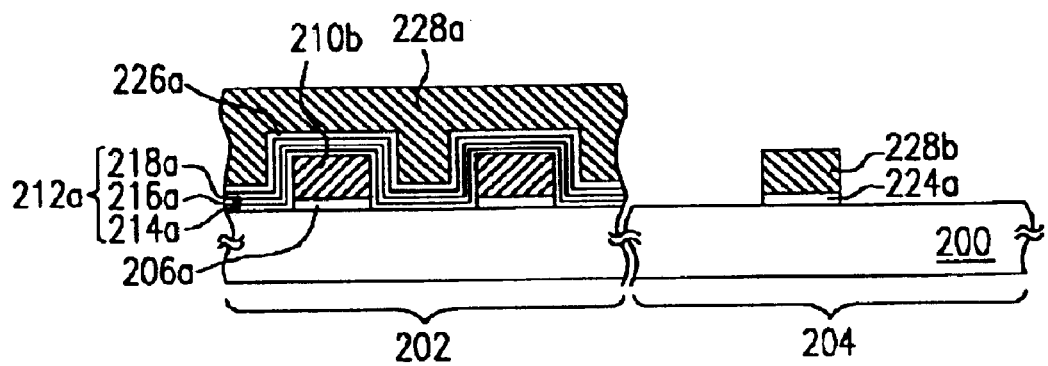

As shown in FIG. 2F, the conductive layer 228 is patterned to form a control gate conductive layer 228a. The inter-gate dielectric layer 212, the conductive layer 210a and the tunnel dielectric layer 206 are patterned to form a stack gate structure (the so-called memory gate) comprising the control gate conductive layer 228a, the inter-gate dielectric layer 212a, the conductive layer 210b and the tunnel dielectric layer 206a. In the meantime, the conductive layer 228 in the peripheral circuit region 204 is also patterned to form a gate structure 232 comprising a gate oxide layer 224a and a conductive layer 228b. Subsequent processes for completing the fabrication of a flash memory are next carried out. Since these processes should be familiar, detailed description is not repeated here.

In the aforementioned method, a passivation layer 220 is formed over the inter-gate dielectric layer 212 above the memory cell region 202. The passivation layer 220 protects the inter-gate dielectric layer 212 against any possible processing damage. Consequently, the quality of the inter-gate dielectric layer 212 can be maintained.

Furthermore, by forming a passivation layer 220 over the inter-gate dielectric layer 212, stronger chemical agents can be deployed to remove the photoresist layer 222 during a cleaning process. In other words, there will be very little polymer residue to contaminate surrounding gate layers after the cleaning step.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a flash memory device, comprising the steps of:
   providing a substrate partitioned into a memory cell region and a peripheral circuit region;
   forming a tunnel dielectric layer over the memory cell region and forming a liner layer over the peripheral circuit region;
   forming a first conductive layer over the substrate;
   patterning the first conductive layer over the memory cell region to form a gate conductive layer;
   forming an inter-gate dielectric layer over the substrate;
   forming a silicon nitride layer over the inter-gate dielectric layer;

removing portions of the silicon nitride layer, the inter-gate dielectric layer, the first conductive layer and the liner layer from the peripheral circuit region;

forming a gate dielectric layer over the peripheral circuit region and converting the remaining portion of the silicon nitride layer over the memory cell region into an oxide layer;

forming a second conductive layer over the substrate; and patterning the second conductive layer, the oxide layer, the inter-gate dielectric layer and the gate conductive layer over the memory cell region to form a plurality of memory gates, and patterning the second conductive layer over the peripheral circuit region to form a plurality of gates.

2. The method of claim 1, wherein the inter-gate dielectric layer comprises an oxide/nitride/oxide composite layer.

3. The method of claim 1, wherein the gate conductive layer comprises a polysilicon layer.

4. The method of claim 1, wherein the step of forming a gate dielectric layer over the peripheral circuit region and converting the remaining portion of the silicon nitride layer in the memory cell region into an oxide layer comprises performing a thermal oxidation process.

5. The method of claim 1, wherein the second conductive layer comprises a polysilicon layer.

6. A method of fabricating a flash memory device, comprising the steps of:

providing a substrate partitioned into a memory cell region and a peripheral circuit region;

forming a tunnel dielectric layer over the memory cell region and forming a liner layer over the peripheral circuit region;

forming a first conductive layer over the substrate;

patterning the first conductive layer over the memory cell region to form a gate conductive layer;

forming a bottom oxide layer over the substrate;

forming a charge-trapping layer over the bottom oxide layer;

forming a top oxide layer over the charge-trapping layer;

forming a silicon nitride layer directly on the top oxide layer;

removing portions of the silicon nitride layer, the top oxide layer, the charge-trapping layer, the bottom oxide layer, the first conductive layer and the liner layer from the peripheral circuit region;

forming a gate dielectric layer over the peripheral circuit region and converting the remaining portion of the silicon nitride layer over the memory cell region into an oxide layer;

forming a second conductive layer over the substrate; and patterning the second conductive layer, the oxide layer, the top oxide layer, the charge-trapping layer, the bottom oxide layer and the gate conductive layer over the memory cell region to form a plurality of memory gates, and patterning the second conductive layer over the peripheral circuit region to form a plurality of gates.

7. The method of claim 6, wherein the charge-trapping layer comprises a silicon nitride layer.

8. The method of claim 6, wherein the gate conductive layer comprises a polysilicon layer.

9. The method of claim 6, wherein the step of forming a gate dielectric layer over the peripheral circuit region and converting the remaining portion of the silicon nitride layer in the memory cell region into an oxide layer comprises performing a thermal oxidation process.

10. The method of claim 6, wherein the second conductive layer comprises a polysilicon layer.

* * * * *